United States Patent [19]

Yoshimura

[11] 3,990,092
[45] Nov. 2, 1976

[54] RESISTANCE ELEMENT FOR SEMICONDUCTOR INTEGRATED CIRCUIT
[75] Inventor: Masayoshi Yoshimura, Tokyo, Japan
[73] Assignee: Hitachi, Ltd., Japan
[22] Filed: Jan. 13, 1975
[21] Appl. No.: 540,340

[30] Foreign Application Priority Data
Jan. 11, 1974 Japan.................................. 49-5959
Feb. 8, 1974 Japan................................ 49-15451

[52] U.S. Cl.................................... 357/51; 357/86
[51] Int. Cl.² ........................................ H01L 27/04
[58] Field of Search............................... 357/51, 86

[56] References Cited
UNITED STATES PATENTS
3,649,883  3/1972  Augustine........................ 357/86 X
3,693,054  9/1972  Anderson............................. 357/86
3,795,828  3/1974  Cavaliere et al................. 357/51 X Primary Examiner—John S. Heyman
Attorney, Agent, or Firm—Craig & Antonelli

[57] ABSTRACT

A semiconductor integrated circuit contains a resistance element, wherein a low resistance region of a first conductivity type, employed for a circuit resistance, is formed within a high resistance region of a second conductivity type, opposite to the first conductivity type. The low resistance region and the high resistance region are connected in parallel, so as to prevent the formation of a parasitic transistor and a parasitic thyristor.

10 Claims, 12 Drawing Figures

RESISTANCE ELEMENT FOR SEMICONDUCTOR INTEGRATED CIRCUIT

BACKGROUND OF THE INVENTION

1. Field of the Invention

The present invention relates to a semiconductor integrated circuit and, more particularly, to a circuit resistance element which does not contain a parasitic transistor or a parasitic thyristor.

2. Description of the Prior Art

In general, a resistance element, as may be employed in a semiconductor integrated circuit, is made up of a diffused low resistance region, which is formed in a portion of a high resistance semiconductor layer, the region and the layer being of opposite conductivity types. Illustrative examples of this type of resistor element are described in Japanese Pat. application publication No. 10461/1971, corresponding to U.S. application Ser. No. 511,197 No. 30400/1972, No. 38657/1970, No. 18093/1971, and No. 43876/1972. For the examples illustrated in these publications, it is often the case that a p-type base region for a transistor, formed with an n⁻-type epitaxial layer isolated by a p-type silicon substrate and a p-type diffused isolation region, is employed for the circuit resistance.

For the isolation of the diffused resistance from the substrate, there is one form wherein it is connected to a power voltage source, and another wherein it is placed in a floating state.

More specifically, where a potential below the power source voltage is supplied to the circuit resistance, the p-type region is employed for the circuit resistance and the power voltage is fed to the n-type epitaxial layer. In this case, no problem arises. However, where a voltage above the power source voltage is supplied to the circuit resistance, the p-type region is employed for the circuit resistance and the n-type epitaxial layer is maintained in the state of a so-called "floating island" which is not connected with any other region. In this case, the problems discussed hereinafter may arise.

FIG. 1 illustrates an example of a SEPP circuit, with a bootstrap connection, wherein only a specified portion has a potential greater than a power source voltage. The SEPP Circuit comprises a push-pull output stage P.P., a driving amplifying stage D.C., a bootstrap condenser $C_1$ and an output coupling condenser $C_2$. The push-pull output stage P.P. comprises n-p-n transistor $Q_1$, p-n-p transistor $Q_2$ and resistors $R_3$ and $R_4$. The driving amplifying stage D.C. Comprises n-p-n transistor $Q_3$, diodes $D_1$ and $D_2$ and resistors $R_1$ and $R_2$. In this circuit, the voltage which is greater than the power source voltage is applied to the junction A between resistors $R_1$ and $R_2$ which are connected to bootstrap capacitor $C_1$. The device structure for implementing this circuit is as illustrated in FIG. 2, wherein an n⁻-type epitaxial layer 2 is the above-referred to "floating island", while a p-type diffused region 4 is employed for resistances $R_1$ and $R_2$.

One problem with this type of circuit is the creation of a parasitic ( p⁻ - n⁻ - p⁻ ) transistor $Q_p$, illustrated in broken lines in FIG. 1, formed between p- type region 4, n⁻ epitaxial layer 2 and p⁻-type substrate 1. Assuming that a leakage current $I_{CBO}$ appears between the n⁻-type epitaxial layer 2 and the p⁻-type substrate 4, due to crystal defects in the n⁻-type layer 2, the parasitic transistor $Q_p$ will cause a current $I_{CEO} = I_{CBO}(1 + h_{fe})$ to flow from the p-type region 4 to the p⁻-type substrate 1. The current of the p-type region of resistances $R_1$ and $R_2$ will be decreased in accordance with the leakage current $I_{CEO}$. As a result, a deviation in the value of the resistance becomes large and the circuit operation deteriorates.

Another problem is the creation of a parasitic thyristor, shown as broken line circuit Spnpn in FIG. 1. Assume, by way of example, that the $h_{fe}$ of the parasitic ( p-n⁻ -p⁻ ) transistor is 50, then the grounded base current gain α ( p-n-p) of the transistor becomes:

$$\alpha = \frac{h_{fe}}{1 + h_{fe}} \approx 0.98 \quad (1)$$

On the other hand, another parasitic n-p-n transistor is created between n-type epitaxial layer 2, p-type substrate 1 and n-type layer 10 ( an n-type inverted layer which is created in the substrate in such a way that a donor element is mixed into the metal tab (electrode) 11 mounted on the opposite principal plane of the p-type substrate 1 ). Both of these transistors contribute to the formation of the parasitic thyristor ( S-p-n-p-n ). Here, the turn-on condition of the parasitic thyristor is determined by $\alpha_{pnp}$ of the parasitic pnp transistor and $\alpha_{npn}$ of the parasitic npn transistor. This condition is defined in accordance with the equation $$\alpha_{pnp} + \alpha_{npn} \geq 1 \quad (2)$$

where $\alpha_{pnp} = 0.98$ from equation (1) if $\alpha_{npn}$ is at least equal to 0.02, the thyristor turn-on phenomenon takes place.

In general, in the above npn parasitic transistor, the diffusion concentration of the n-type layer (emitter) is low, and the area of the p-type substrate (face) is very wide. Accordingly, while $\alpha \leq 0.02$, there may arise the case where $\alpha = 0.2$ or greater. When the parasitic thyristor is turned on, the element will be destroyed.

BRIEF SUMMARY OF THE INVENTION

The present invention has been made in order to solve the problems discussed above. One object of the invention is to provide a resistance element for an integrated circuit, wherein the structure of the resistance element is such that no parasitic transistor is created, so that leakage current is reduced. Moreover, the present invention is intended to prevent the destruction of the element by preventing the creation of a parasitic thyristor. Another object of the invention is to reduce the non-uniformity in the distribution of the resistance values of the resistance elements.

A fundamental construction of the invention includes a semiconductor substrate on which at least a first conductivity type high resistance region is formed. A lower resistance region is formed within the first conductivity type region and the low resistance region has a conductivity type opposite thereto. A first electrode is connected in common with one end portion of the high resistance region and one end portion of the low resistance region. A second electrode commonly connects the other end portion of the high resistance region and the other end portion of the lower resistance region.

In accordance with the construction of the present invention, the creation of a parasitic pnp transistor and a parasitic thyristor is substantially eliminated, the resistance can be easily designed as in the case of employing a p-type region, and a resistance formed can be

DETAILED DESCRIPTION

Figure 1:
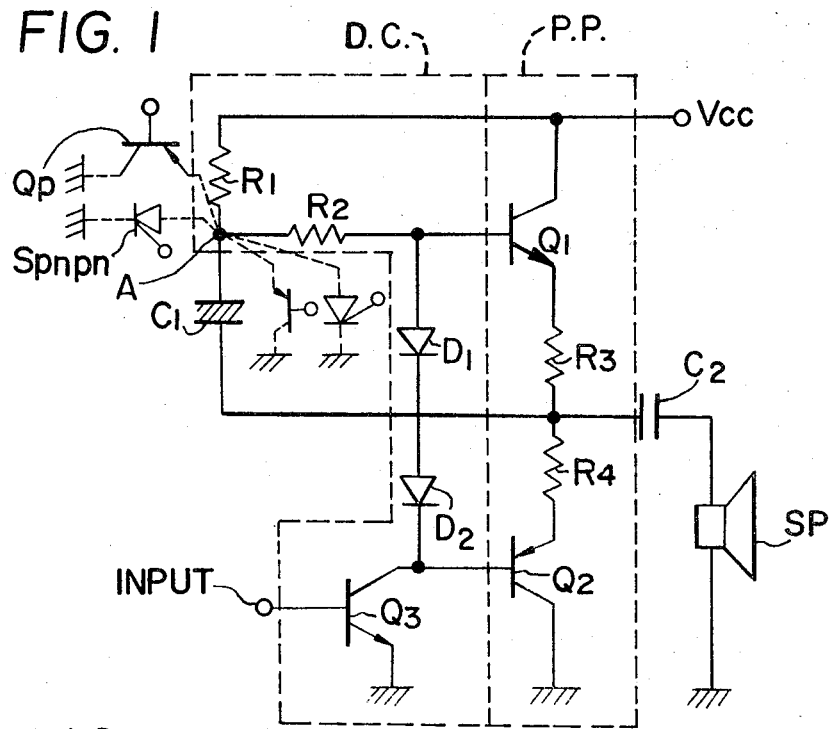
FIG. 1 is a circuit diagram showing an example of a SEEP circuit within a bootstrap connection.
Figure 2:
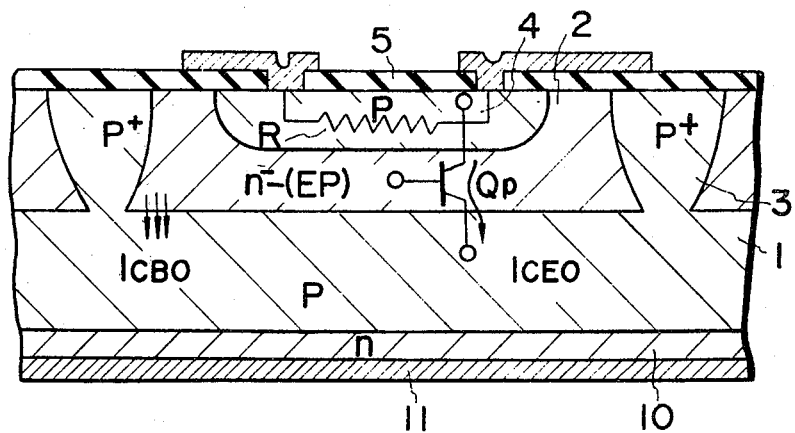
FIG. 2 is a sectional view showing an example of a prior art semiconductor resistance body.
Figure 3:
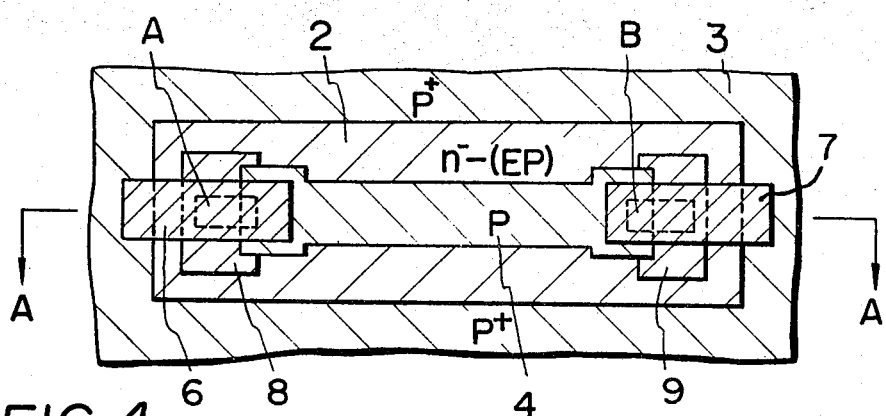
FIG. 3 is a plan view of a resistance body making up an embodiment of the present invention.
Figure 4:
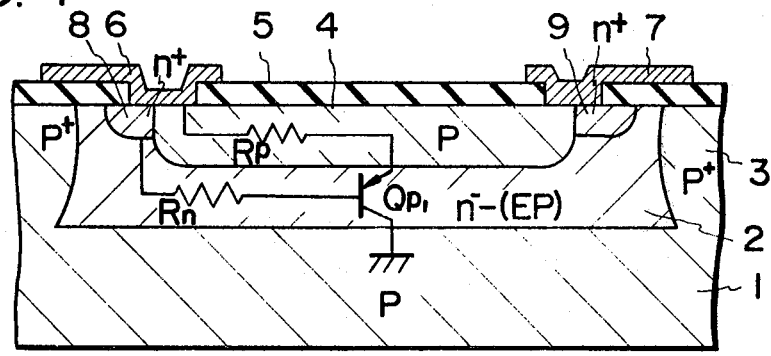
FIG. 4 is a sectional view taken along line A—A of FIG. 3.

In the resistance circuit element shown in FIGS. 3 and 4, an $n^-$ semiconductor epitaxial layer 2 is formed on a p-type silicon substrate 1. In the epitaxial layer 2 a $p^+$ type isolation region 3 is formed to isolate pockets of $n^-$ epitaxial layer from each other, the isolation region extending to the substrate as shown. Within the epitaxial pocket 2 there is formed a p-type diffused resistance region 4. On the surface of the overall structure there is formed an insulating film 5 of silicon dioxide, while aluminum electrodes 6 and 7 are connected to both ends of the p-type diffused resistance region 4. Contiguous with opposite ends of the p-type regions 4 as well as respective electrodes 6 and 7 are $n^+$ diffused contact regions 8 and 9 of low resistance.

In this resistance element, normally a parasitic pnp transistor would be created such that the p-type region 4 and the $n^-$ epitaxial layer 2 are forward biased. In order to prevent the parasitic pnp transistor from turning on, the p-type region and the $n^-$ layer may be reverse-biased. For this purpose, the p-type region and the $n^-$ type layer are connected in parallel between the electrodes 6 and 7. For this purpose, regions 8 and 9 are provided with the electrodes 6 and 7 connected thereto at contact surface portions A and B. Where this arrangement, the p-type region 4 will be connected in parallel at opposite ends thereof with the $n^-$ type layer 2. Thus, if the potential of the p-type region 4 increases, that of the $n^-$ type layer will also increase in accordance with the increase in the potential.

Figure 5:
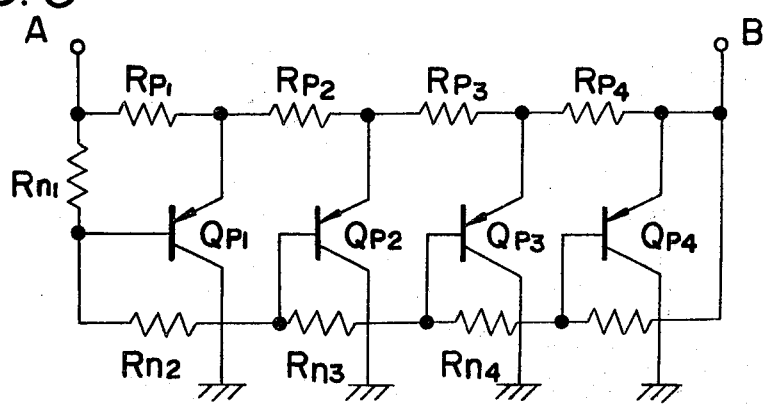
FIG. 5 is an equivalent circuit diagram for the device structure shown in FIG. 4.

FIG. 5 illustrates an equivalent circuit diagram of the structure shown in FIGS. 3 and 4 wherein the resistances $R_p$ and $R_n$ of the region 4 and the layer 2, respectively, are divided into separate portions $R_{p1} \ldots$, $R_{p4}$ and $R_{n1} \ldots R_{n4}$, respectively. Transistors $Q_{p1}$, $Q_{p2}$ $\ldots$ represent the parasitic pnp transistor $Q_p$ divided into separate transistors as shown.

As is apparent from the equivalent circuit diagram shown in FIG. 5, the emitter of the parasitic transistor $Q_{p1}$ will have a voltage applied thereto by way of the resistance $R_{p1}$, and the base of this transistor will have a voltage applied thereto through the resistance $R_{n1}$. The emitter voltage and the base voltage reach substantially the same potential at all points, since the p-type region resistance and the $n^-$-type layer resistance are connected in parallel. Accordingly, due to the fact that the emitter potential is substantially equal to the base potential, the $h_{fe}$ in the low current region may be considered for the parsitic transistor $Q_{p1}$ to be very small. The injection of holes from the p-type region 4 into the $n^-$ layer 2 is prevented. The same applies for transistors $Q_{p2}$, $Q_{p3}$ and $Q_{p4}$. As explained previously, the leakage current $I_{CEO}$ of the parasitic transistor $Q_p$ becomes:

$$I_{CEO} \approx I_{CBO} + I_{CBO} \cdot h_{fe}$$

Since $h_{fe}$ is approximately equal to zero, $I_{CEO} \approx I_{CBO}$ This current $I_{CEO}$ is supplied from the $n^+$ type regions 8 and 9.

Since the $h_{fe}$ of each parasitic pnp transistor is substantially equal to zero, the $\alpha_{pnp}$ also becomes very small. In addition, the resistance ( of the p-type region ) and the $n^-$-type layer becomes substantially at the same potential, so that injection becomes difficult. As a result, it becomes difficult to turn on the normally formed parasitic thyristor. Namely, $\alpha_{pnp} + \alpha_{npn} \ll 1$.

In accordance with the present invention, the design of the circuit resistance follows the equation:

$$R_o = \frac{R_n \cdot R_n^-}{R_p + R_n^-} = \frac{R_p}{1 + \frac{R_p}{R_n^-}}$$

If $R_p \ll R_n^-$, the design of the resistance will be determined in accordance with the equation $R_o \approx R_p$.

In accordance with the circuit configuration and structure design shown in FIGS. 3 and 4, the p-type region 4 and the $n^-$-epitaxial layer 2 are connected in parallel at opposite ends thereof, so that as the potential of the p-type region 4 increases, that of the $n^-$-type epitaxial layer increases. In this manner the same potential is maintained at all points along the p- $n^-$-epitaxial junction. Therefore, the emitter potential is approximately equal to the base potential within the parasitic transistor constructed of the p-type region 4, the $n^-$ epitaxial layer 2 and the p-type substrate 1. Consequently, $h_{fe}$ may be considered to be in the low current region and very small. Namely, the injection of holes from the p-type region 4 to the $n^-$ epitaxial layer 2 is prevented, so that $h_{fe}$ of the parasitic transistor is substantially nil. As was indicated above, this effectively prevents turn-on of a parasitic thyristor.

While the embodiment discussed above has the advantages indicated, there may be occasion where the parasitic thyristor is turned on, in response to the application of an instantaneous overvoltage.

More specifically, the potentials of the $n^+$ regions 8 and 9, in contact with electrodes 6 and 7, respectively, are assumed to be substantially equal to the potentials at the respective electrodes 6 and 7, themselves, since the surface resistance is very low. The potential of the p-type region 4 in contact with electrodes 6 and 7 is also assumed to be substantially equal to those of the respective electrodes 6 and 7.

Figure 6A:
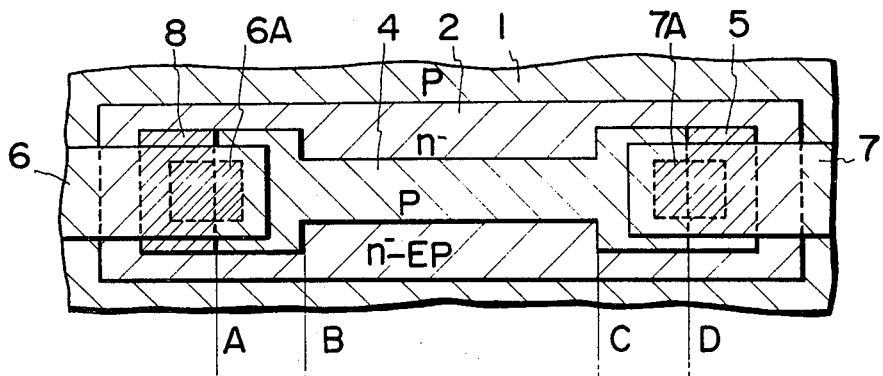
FIG. 6A is a plan view of a further embodiment of the invention.
Figure 6B:
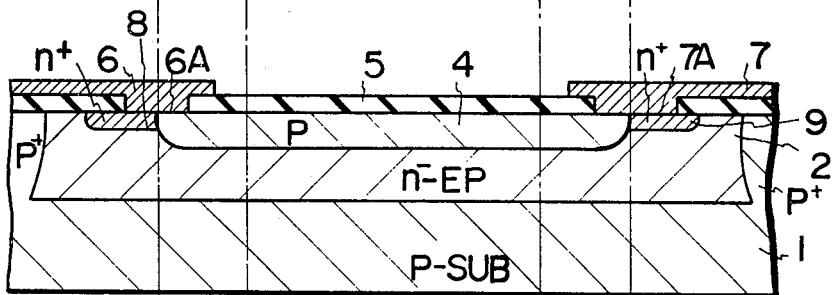
FIG. 6B is a vertical sectional view of FIG. 6A.
Figure 6C:
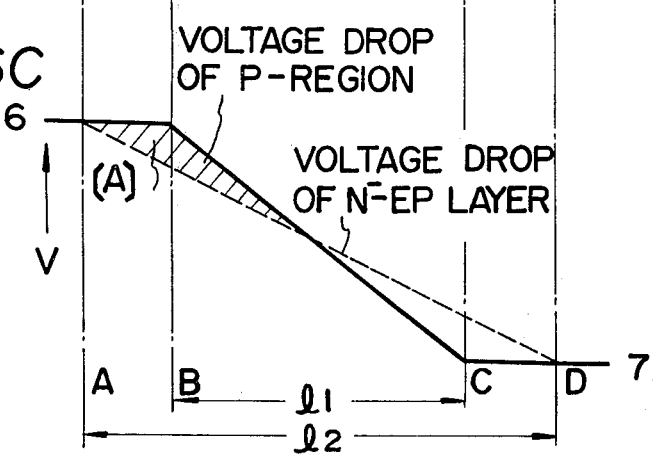
FIG. 6C is a diagram illustrating the state of the voltage drop at corresponding positions of the device structure shown in FIGS. 6A and 6B.

If we now consider in more detail the distributed resistance of the p-type region 4, there will be a substantial resistance within a region $l_1$ as shown in FIG. 6C, between portions B and C, also shown in FIG. 6A and also a substantial resistance within the epitaxial layer 2 within a region $l_2$ between points A and B shown in FIGS. 6A and 6C.

As explained previously, the electrode voltages at points A and B are such that $V_a = V_B$ while the voltages at electrode points C and D are such that $V_C = V_D$.

Because of this, the voltage drop induced in the resistance region 4 decreases rectilinearly between points B and C as shown by the full line in FIG. 6C, while the voltage drop induced within the epitaxial layer 2 is that between points A and D as shown by the broken line FIG. 6C.

When the voltage drop of the p-region 4 resistance and that of the n-type epitaxial resistance 2 are compared, the potential of the p-type region 4 resistance is greater than that of the epitaxial layer resistance within the crosshatched portion ( A ) as shown in FIG. 6C. This indicates that the p-n⁻-epitaxial layer junction at the point (A) is forward biased. In this manner, the p-n⁻-epitaxial junction constructed of the region 4 and the epitaxial layer 2 includes a part which is forward biased. When an over-voltage is applied to the circuit resistance under these conditions, the parasitic thyristor will turn on.

Figure 7A:
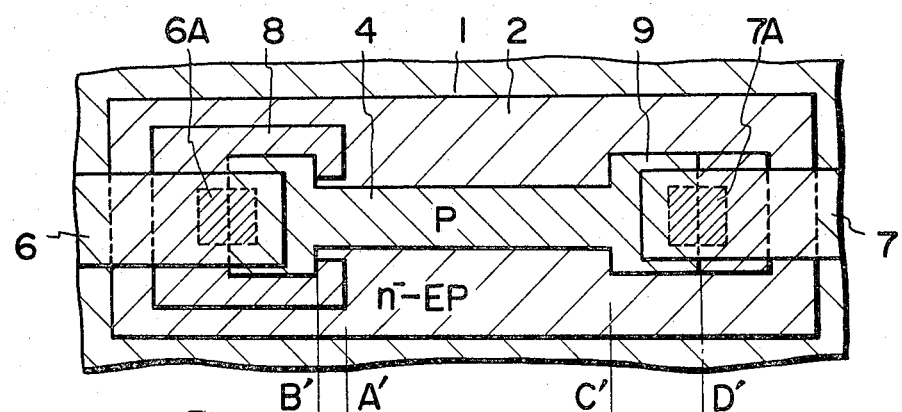
FIG. 7A is a plan view of still a further embodiment of the present invention.
Figure 7B:
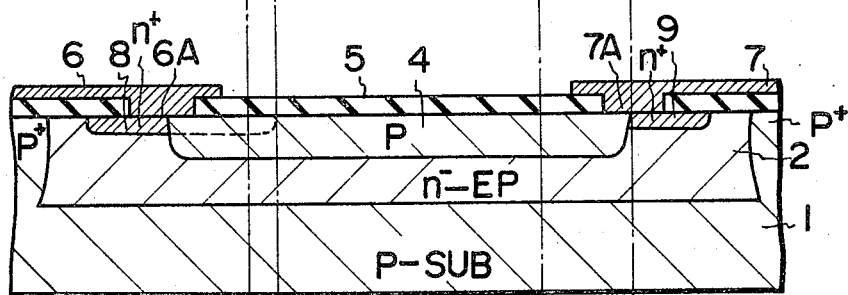
FIG. 7B is a vertical sectional view of FIG. 7A.
Figure 7C:
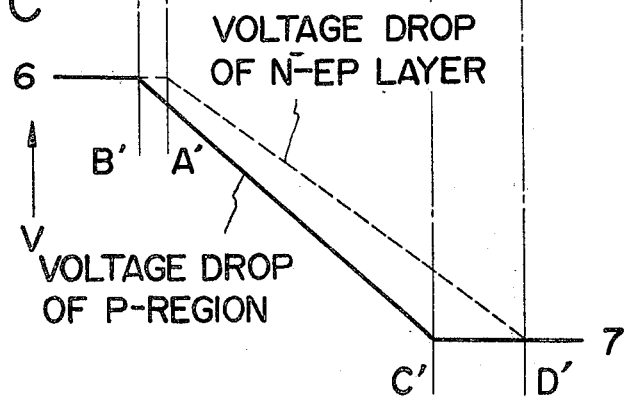
FIG. 7C is a diagram illustrating the state of the voltage drop along corresponding positions of the embodiment shown in FIGS. 7A and 7B.

In order to prevent this parasitic thyristor turn-on, due to an over-voltage, a further embodiment of the invention, as illustrated in FIGS. 7A – 7C may be employed. In accordance with this circuit, the p-type region and the n⁻ epitaxial layer are always reverse-biased so as to prevent the parasitic thyristor from being turned on.

Where the above discussed forward biased condition is induced in the p-n⁻-epitaxial junction, wherein region 4 and layer 2 have their opposite ends connected to respective eletrodes, so as to be connected in parallel, the following conditions exist. First of all, at electrode 6, where the position of the conductive body formed on the p region 4 (since the aluminum electrodes 6 and 7 and the n⁺ regions 8 and 9 disposed in contact with the p-type region 4 have substantially the same action, they are treated as one conductive body) is closer to the electrode 7 than the position of the conductive body formed on the epitaxial layer 2, the voltage at the p-type region 4 becomes higher than that of the epitaxial layer 2. Secondly, at the electrode 7, where the position of the conductive body formed on the epitaxial layer 2 is closer to the electrode 6 than the position of the conductive body formed on the region 4, the region 4 will have a voltage higher than the epitaxial layer 2.

In accordance with the embodiments shown in FIGS. 7A–7C at the electrode 6, the n⁺ region 8, being a conductive body, is somewhat extended towards the electrode 7, so that point A', where the resistance of the n⁻ epitaxial layer 2 begins, may be closer to the electrode 7 than point B' where the resistance of the region 4 begins. On the other hand, at the electrode 7, point D' at which the resistance element within the layer 2 terminates is situated, in a fashion similar to the embodiment shown in FIGS. 6A–6C, so as to be more distant from the electrode 6 than point C', at which the resistance element within region 4 terminates.

In accordance with the construction of this embodiment, at the electrode 6, the forward end of the conductive body formed on the p-type body 4 is at the same position where it is formed on the epitaxial layer 2. The forward end of the conductive body formed on the epitaxial layer 2 extends toward the electrode 7 beyond the forward end of the conductive body formed on the region 4.

At the other end of the resistance elements, the forward end of the conductive body formed on the region 4 extends toward electrode 6 beyond the forward end of the conductive body formed on the epitaxial layer 2. Thus, as shown in FIG. 7C the voltage drop across region 4 becomes equal to the voltage drop within the epitaxial layer 2, or the n⁻-epitaxial layer 2 always has a higher voltage drop than the p-type region 4. As a result, the p-n⁻-epitaxial junction is always maintained in a reverse-biased state. Thus, even when an over-voltage is applied to the circuit resistance element, the parasitic thyristor will not be turned on, due to the reverse bias.

Figure 8:
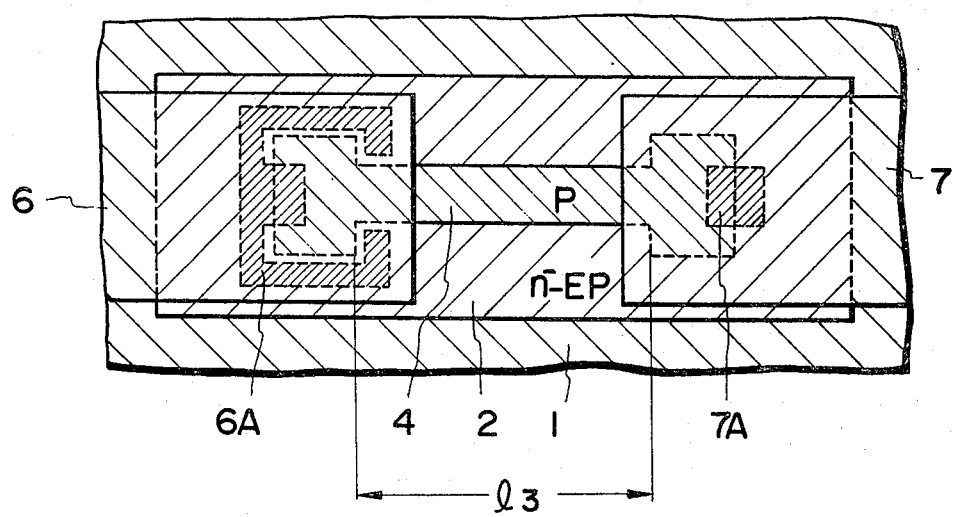
FIG. 8 is a plan view illustrating still a further embodiment of the present invention.

In accordance with a further embodiment of the invention as shown in FIG. 8, in addition to providing an n⁺ diffusion region as a conductive body, the contact portion 6A of the aluminum electrode 6 may extend thereon, so as to change the resistance value. In this figure $l_3$ denotes the length of the portion which becomes the substantial resistance. The circuit resistance consists of the parallel resistances of the opposite conductivity types of the epitaxial resistance layer and the diffused region within the layer. In this case, however, a relatively higher voltage is applied to the n-region.

In accordance with the foregoing embodiments of the invention, the following effects are achieved.

1. Since, with the parallel circuit resistances, the entire pn junction between the p-region and the n⁻-epitaxial layer is perfectly reverse-biased, the appearance of a parasitic thyristor is prevented, so that destruction of the element due to turn-on of the thyristor does not occur.

2. Due to the above feature (1), even when the circuit resistance is applied with a voltage greater than the power supply voltage, it is not affected by the parasitic transistor and the parasitic thyristor.

3. The formation of the resistance element can be carried out by merely changing the diffusion mask pattern, so as not to involve a considerable amount of complicated processing.

The present invention is also applicable to devices wherein the first conductivity type region, for example, will be n⁻-epitaxial layer, is formed therein, with the opposite conductivity type region (p-type region).

While I have shown and described several embodiments in accordance with the present invention, it is understood that the same is not limited thereto but is susceptible of numerous changes and modifications as known to a person skilled in the art and, I therefore, do not wish to be limited to the details shown and described herein but intend to cover all such changes and modifications as are obvious to one of ordinary skill in the art.

I claim:

1. A resistance element for a semiconductor integrated circuit comprising:
   a semiconductor substrate of a first conductivity type;
   a first semiconductor region of a second conductivity type, opposite said first conductivity type, disposed in a first surface portion of said semiconductor substrate;
   a second semiconductor region of said first conductivity type disposed in a portion of the surface of said first semiconductor region;

a first electrode conductivity connected to both said first and second semiconductor regions at a first end portion of said second semiconductor region; and a second electrode conductively connected to each of said first and second semiconductor regions at the other end portion of said semiconductor region opposite said one end thereof; and wherein the resistance of said first semiconductor region between said first and second electrodes is greater than that of said second semiconductor region.

2. A resistance element for a semiconductor integrated circuit according to claim 1, further including a third semiconductor region of said conductivity type and having an impurity concentration higher than that of said first semiconductor region disposed contiguous to said first and second semiconductor regions at the surface portion thereof whereon said first electrode is conductively connected thereto.

3. A resistance element for a semiconductor integrated circuit according to claim 2, further including a fourth semiconductor region of said second conductivity type and having an impurityy concentration higher than that of said first semiconductor region, disposed in a surface portion of said first semiconductor region contiguous to said other end of said second semiconductor region at which portion said second electrode is conductively connected thereto.

4. A resistance element for a semiconductor integrated circuit according to claim 2, wherein said second semiconductor region includes first, second and third contiguous portions, said first and third portions being relatively wider than said second semiconductor portion, and being located at said one and other ends, respectively, of said second semiconductor region.

5. A resistance element for a semiconductor integrated circuit according to claim 3, wherein said second semiconductor region includes first, second and third contiguous portions, said first and third portions being relatively wider than said second portion, and being located at said one and other ends, respectively, of said second semiconductor region.

6. A resistance element for a semiconductor integrated circuit according to claim 5, wherein the distance between said third semiconductor region and said other end of said second semiconductor region is less than the distance between the first portion of said second semiconductor region and said other end thereof.

7. A resistance element for a semiconductor integrated circuit according to claim 1, wherein said second semiconductor region is made up of first, second and third contiguous portions, said first and third portions being wider than said second portion thereof, and wherein the distance between said first electrode and said other end of said second region is less than the distance between said first portion of said second region and the other end thereof.

8. A resistance element comprising:

a semiconductor body of a first conductivity type;

a first semiconductor region of a second conductivity type, opposite said first conductivity type, disposed in contact with said semiconductor body so as to form a pn junction therebetween; and wherein one end of said semiconductor body and said semiconductor region are electrically connected in common, while another end thereof, opposite said one end, are connected in common, thereby creating parallel resistances between said one end and said other end;

wherein said pn junction is reverse-biased at each position therealong between said one end and said other end thereof; and wherein the resistance between said one end and said other end of said semiconductor body is greater than that of said first semiconductor region 9. In a semiconductor integrated circuit including:

a driving amplifying stage comprising a driving amplifying means and load resistive means connected to series between first and second voltage sources, said load resistive means comprising at least two series connected resistors;

a push-pull output stage having input and output terminals for amplifying an output signal from said driving amplifying stage; and a bootstrap condenser coupled between the juncture of said two load resistors and the output terminal of said output push-pull amplifying stage;

the improvement wherein at least one of said load resistors comprises a semiconductor substrate of a first conductivity type;

a first semiconductor region of a second conductivity type, opposite said first conductivity type, disposed in a first surface portion of said semiconductor substrate;

a second semiconductor region of said first conductivity type disposed in a portion of the surface of said first semiconductor region;

a first electrode conductively connected to both said first and second semiconductor regions at a first end portion of said second semiconductor region; and a second electrode conductively connected to each of said first and second semiconductor regions at the other end portion of said second semicondcuctor region opposite said one end thereof.

10. A semiconductor integrated circuit according to claim 9, wherein the resistance between said first and second electrodes of said first semiconductor region in said at least one of said load resistors is greater than that of said second semiconductor region.

* * * * *